(12) United States Patent
McCarroll

(10) Patent No.: US 6,211,806 B1
(45) Date of Patent: *Apr. 3, 2001

(54) EFFICIENT ERROR CORRECTION IN PIPELINED ANALOG-TO-DIGITAL CONVERTERS

(75) Inventor: Benjamin J. McCarroll, Portland, OR (US)

(73) Assignee: Maxim Integrated Products, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/392,069

(22) Filed: Sep. 8, 1999

Related U.S. Application Data

(63) Continuation of application No. 08/982,439, filed on Dec. 2, 1997.

(51) Int. Cl.[7] .................................................. H03M 1/38

(52) U.S. Cl. ............................................ 341/161; 341/155
(58) Field of Search ..................................... 341/161, 156, 341/155, 144

(56) References Cited

U.S. PATENT DOCUMENTS

| | | | | |
|---|---|---|---|---|
| 4,297,527 | * | 10/1981 | Pate ........................................... 179/1 |
| 4,782,285 | * | 11/1988 | Bristol et al. .......................... 324/98 |
| 5,047,772 | * | 9/1991 | Ribner ................................. 341/156 |
| 5,389,927 | * | 2/1995 | Turney et al. ....................... 341/139 |
| 5,955,978 | * | 9/1999 | Fielder et al. ....................... 341/118 |

* cited by examiner

Primary Examiner—Peguy JeanPierre
(74) Attorney, Agent, or Firm—Blakely, Sokoloff, Taylor & Zafman LLP

(57) ABSTRACT

The present invention discloses a method and apparatus for correcting errors in N digital word generated by N+1 pipelined analog-to-digital converters. The method comprises the steps of: (1) synchronizing the N digital words by N groups of pipeline registers; and (2) correcting the synchronized N digital words by performing either an incrementing operation or a decrementing operation based on an adjustment value.

18 Claims, 2 Drawing Sheets

EFFICIENT ERROR CORRECTION IN PIPELINED ANALOG-TO-DIGITAL CONVERTERS

This application is a continuation of 08/982,439 filed Dec. 2, 1997.

BACKGROUND OF THE INVENTION

1. Field of the Invention

The present invention relates to pipelined analog-to-digital converters. In particular, the present invention relates to the correction of conversion errors in pipelined analog-to-digital converters.

2. Description of Related Art

Pipelined analog-to-digital converters (ADC's) require adders to generate the correct digital output where the digital outputs of the preceding stages are delayed, scaled, and added relative to the digital outputs of the subsequent stages.

The subsequent stages represent the correction of the preceding stages. The adders in the subsequent stages are used to correct or adjust the result of the analog-to-digital conversion in the preceding stages and at the same time introduce the additional resolution bits. The correction or adjustment is added to the preceding value. This correction value may be a positive number or a negative number. Using 2's complement arithmetic, a negative number is sign extended before the addition.

Prior art methods employ N adders for an N-stage pipelined ADC to perform the digital correction. The size of each adder is a function of the significance of the pipeline stage. As more resolution bits are added when the pipeline stages go to less and less significant bits, the size of the adders becomes larger and larger. The area for realizing the adders becomes significant. For example, a four-stage pipelined ADC with 4-bits per stage requires 4 adders: a 7-bit adder in the first stage, a 10-bit adder in the second stage, a 13-bit adder in the third stage, and a 19-bit adder in the fourth and last stage. Each N-wide adder takes 1 half adder and N-1 full adders. A half adder takes one XOR gate and one AND gate; a full adder takes two XOR gates, two AND gates, and one OR gate. The total amount of hardware for the digital correction is, therefore, significant.

Accordingly, it is desirable to have a method and apparatus to provide the digital correction in a pipelined ADC with a smaller integrated circuit area and having less complexity.

BRIEF DESCRIPTION OF THE DRAWINGS

The objects, features and advantages of the present invention will become apparent from the following detailed description of the present invention in which.

DESCRIPTION OF THE PRESENT INVENTION

The present invention discloses a method and apparatus for efficient digital correction in pipelined analog-to-digital converters. The digital corrector is implemented as an incrementer/decrementer. For N-stage pipelined ADC; N correctors are cascaded to produce the complete digital word. Using the incrementer/decrementer as the corrector reduces the amount of hardware and complexity significantly.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Figure 1:
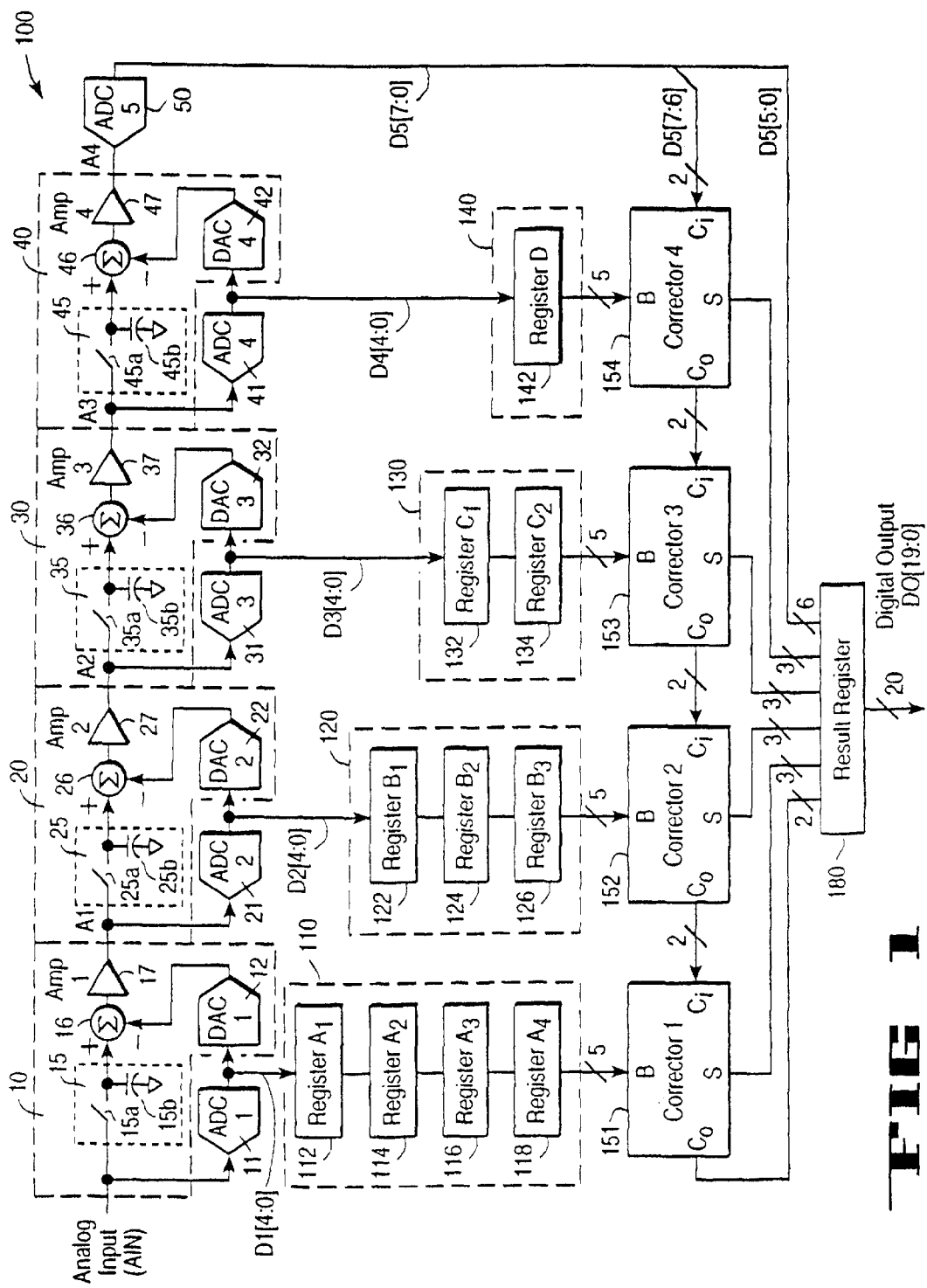
FIG. 1 is a diagram illustration of one embodiment of the converter 100 in accordance with the teachings of the present invention.

Referring to FIG. 1, a diagram illustrating one embodiment of the converter 100 in accordance with the teachings of the present invention is shown. It is appreciated that the diagram shown in FIG. 1 is used for illustrative purposes only. In this embodiment, there are 4 pipelined stages to produce a 20-bit result output. The converter 100 comprises (1) 4 cascaded digital-to-analog (DAC) sections 10, 20, 30, and 40; (2) 5 sub analog-to-digital converters (ADC's) 11, 21, 31, 41, and 50; (3) 4 pipelined register groups 110, 120, 130, and 140; (4) 4 correctors 151, 152, 153, and 154; and (5) a result register 180.

The four DAC sections 10, 20, 30, and 40 are essentially similar. The DAC section 10 handles the most significant correction. The DAC sections 20 and 30 handle the next less significant corrections. The DAC section 40 handles the least significant correction. For brevity, only the DAC section 10 will be described. The other DAC sections 20, 30, and 40 are similar. The DAC section 10 comprises a digital-to-analog converter 1 (DAC1) 12, a track-and-hold 15, an analog subtractor 16, and a residue amplifier 17. The DAC1 12 converts the digital values, as produced by the corresponding ADC1, to an adjusting analog signal which is subtracted from the comparing analog signal, the output of the track-and-hold 15, by the subtractor 16. The track-and-hold 15 includes a switch 15a and a capacitor 15b. The switch is provides the tracking function: when the switch is closed, the output of the track-and-hold tracks or follows the analog input. The capacitor 15b provides the hold function: when the switch is open, the analog value is held by the capacitor 15b. The subtractor 15 performs the subtraction between the track-and-hold output and the DAC1 output. The track-and-hold output is referred to as a comparing analog signal. The difference between the comparing analog signal (the track-and-hold output) and the adjusting analog signal (the DAC1 output) is then amplified and buffered by the amplifier 17 to produce the residue signal which is fed to the next subsequent stage, the second DAC section 20. The ADC2 21 converts the residue of the preceding stage into the next less significant bits which are converted back to analog signal by the DAC2 22. The function of the DAC sections 20, 30, and 40 can be described in a similar manner.

The sub ADC's 11, 21, 31, 41, and 50 convert the analog signals to digital words. Each digital word, or slice, represents the converted value of the residue analog signal of the preceding stage except for the most significant word which represents the converted value at 5-bit resolution of the analog input. The 5-bit word is used to cover the range of states in the converters. In one embodiment, the number of states is 17. The sub ADC1 11 converts the analog input into a 5-bit digital word D1[4:0]. The DAC section 10 receives D1[4:0] and the analog input AIN to produce the residue analog signal A1. The sub ADC2 21 converts the residue analog signal A1 into a 5-bit digital word D2[4:0]. The DAC section 20 receives D2[4:0] and the residue analog signal A1 and produces the residue analog signal A2. The sub ADC2 31 converts the residue analog signal A2 into a 5-bit digital word D3[4:0]. The DAC section 30 receives D3[4:0] and the residue analog signal A2 and produces the residue analog signal A3. The sub ADC2 41 converts the residue analog signal A3 into a 5-bit digital word D4[4:0]. The DAC section 40 receives D4[4:0] and the residue analog signal A3 and produces the residue analog signal A4. Finally, the sub ADC 50 converts the residue analog signal A4 into an 8-bit digital word D5[7:0]. The 8-bit word is used to cover the range of states in the converter at the last stage. In one embodiment, the number of states is 136.

The pipelined register groups 110, 120, 130 and 140 align the digital words in time so that the corresponding words arrive at the correctors at the proper time. The pipeline register groups 110, 120, 130 and 140 perform the synchronization of the digital words to time align the digital bits for correcting. The pipelined register group 110 includes 4 registers 112, 114, 116 and 118 to ripple the digital word D1[4:0] through 4 clock delays. The pipelined register group 120 includes 3 registers 122, 124, and 126 to ripple the digital word D2[4:0] through 3 clock delays. The pipelined register group 130 includes two registers 132 and 134 to ripple the digital word D3[4:01] through 2 clock delays. The pipelined register group 140 includes one register 142 to ripple the digital word D4[4:0] through one clock delay. The final digital word D5[7:0] is available without a pipeline delay. The 4 pipelined 5-bit digital word then appear at the corresponding correctors at the same time together with the D5[7:0].

The correctors 151, 152, 153 and 154 perform digital correction of the converted digital words. Each of the correctors provides the adjustment to the preceding stages by incrementing or decrementing a quantity in the range [−2, −1, 0 and 1]. The corrector 154 is the least significant section, taking the 2 bits D5[7:6] as the carry inputs. The carry outputs of the corrector 154 become the carry inputs of the next significant corrector 153. The carry outputs of the corrector 153 become the carry inputs of the next significant corrector 152. The carry outputs of the corrector 152 become the carry inputs of the most significant corrector 151. Finally, the carry outputs of the corrector 151 become the two most significant bits DO[19:18] of the final digital output DO[19:0].

The result register 180 receives the results of the correctors 151, 152, 153 and 154, including the final carry outputs of the most significant corrector 151. The result register 180 also receives the least significant 6 bits of D5[7:0], D5[5:0] as the least significant 6 bits of the result. The final result is available as a 20-bit digital output DO[19:0].

In the pipelined analog-to-digital converter 100, the digital correction is performed by the correctors 151, 152, 153 and 154 in an efficient manner.

Figure 2:
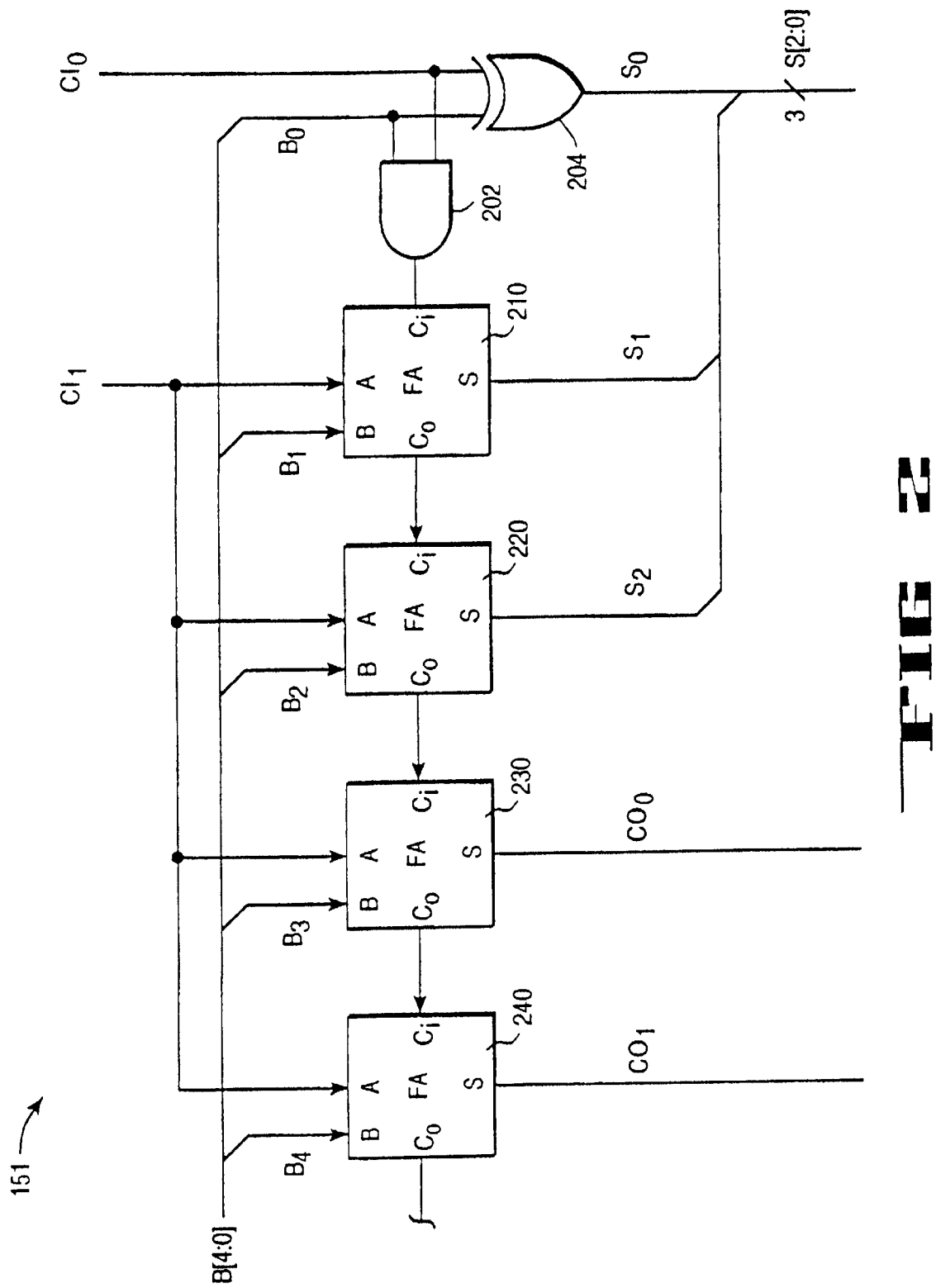
FIG. 2 is a diagram illustration of one embodiment of a corrector that operates in accordance with the teachings of the present invention.

Referring to FIG. 2, a diagram illustrating one embodiment of the corrector 151 is shown. The corrector 151 is the same as the correctors 152, 153 and 154. The corrector 151 includes one AND gate 202, one Exclusive-OR gate 204, and four full adders (FA's) 210, 220, 230 and 240. The inputs to the corrector 151 include two carry inputs CI1 and CI0 and 5 data inputs B[4:01]. The outputs of the corrector 151 include two carry outputs CO1 and CO0 and three result outputs S[2:0].

The corrector 151 performs incrementing or decrementing by an adjustment value of −2, −1, 0, or +1. This adjustment value represents the correction of pipeline stage by a subsequent pipeline stage. For this range of values, two bits for the carry inputs are sufficient. The carry in is sign extended. Furthermore, the outputs of the corrector are also within this range, so two bits for the carry outputs are sufficient. The design of the corrector 151 is based on the truth table given in Table 1. The number format is 2's complement. The binary codings for the carry inputs and outputs are as follows:

| Binary | Decimal | | |
|---|---|---|---|
| 00 | 0 | | |
| 01 | 1 | | |
| 10 | −2 | | |
| 11 | −1 | | |
| Ci (Binary) | B (Hex/Decimal) | S (Hex and Decimal) | Co (Binary) |
| 00 | 18/−8 | 0 | 11 |
| 00 | 19/−7 | 1 | 11 |
| 00 | 1A/−6 | 2 | 11 |
| 00 | 1B/−5 | 3 | 11 |
| 00 | 1C/−4 | 4 | 11 |
| 00 | 1D/−3 | 5 | 11 |
| 00 | 1E/−2 | 6 | 11 |
| 00 | 1F/−1 | 7 | 11 |
| 00 | 00/0 | 0 | 00 |
| 00 | 01/1 | 1 | 00 |
| 00 | 02/2 | 2 | 00 |
| 00 | 03/3 | 3 | 00 |
| 00 | 04/4 | 4 | 00 |
| 00 | 05/5 | 5 | 00 |
| 00 | 06/6 | 6 | 00 |
| 00 | 07/7 | 7 | 00 |
| 00 | 08/8 | 0 | 01 |
| 01 | 18/−8 | 1 | 11 |
| 01 | 19/−7 | 2 | 11 |
| 01 | 1A/−6 | 3 | 11 |
| 01 | 1B/−5 | 4 | 11 |
| 01 | 1C/−4 | 5 | 11 |
| 01 | 1D/−3 | 6 | 11 |
| 01 | 1E/−2 | 7 | 11 |
| 01 | 1F/−1 | 0 | 00 |
| 01 | 00/0 | 1 | 00 |
| 01 | 01/1 | 2 | 00 |
| 01 | 02/2 | 3 | 00 |
| 01 | 03/3 | 4 | 00 |
| 01 | 04/4 | 5 | 00 |
| 01 | 05/5 | 6 | 00 |
| 01 | 06/6 | 7 | 00 |
| 01 | 07/7 | 0 | 01 |
| 01 | 08/8 | 1 | 01 |
| 10 | 18/−8 | 6 | 10 |
| 10 | 19/−7 | 7 | 10 |
| 10 | 1A/−6 | 0 | 11 |
| 10 | 1B/−5 | 1 | 11 |
| 10 | 1C/−4 | 2 | 11 |
| 10 | 1D/−3 | 3 | 11 |
| 10 | 1E/−2 | 4 | 11 |
| 10 | 1F/−1 | 5 | 11 |
| 10 | 00/0 | 6 | 11 |
| 10 | 01/1 | 7 | 11 |
| 10 | 02/2 | 0 | 00 |
| 10 | 03/3 | 1 | 00 |
| 10 | 04/4 | 2 | 00 |
| 10 | 05/5 | 3 | 00 |
| 10 | 06/6 | 4 | 00 |
| 10 | 07/7 | 5 | 00 |
| 10 | 08/8 | 6 | 00 |
| 11 | 18/−8 | 7 | 10 |
| 11 | 19/−7 | 0 | 11 |
| 11 | 1A/−6 | 1 | 11 |
| 11 | 1B/−5 | 2 | 11 |
| 11 | 1C/−4 | 3 | 11 |
| 11 | 1D/−3 | 4 | 11 |
| 11 | 1E/−2 | 5 | 11 |
| 11 | 1F/−1 | 6 | 11 |
| 11 | 00/0 | 7 | 11 |
| 11 | 01/1 | 0 | 00 |
| 11 | 02/2 | 1 | 00 |
| 11 | 03/3 | 2 | 00 |

-continued

| | | | |
|----|------|---|----|
| 11 | 04/4 | 3 | 00 |
| 11 | 05/5 | 4 | 00 |
| 11 | 06/6 | 5 | 00 |
| 11 | 07/7 | 6 | 00 |
| 11 | 08/8 | 7 | 00 |

Each corrector includes 4 full adders, 1 AND gate and 1 XOR gate. Compared to the prior art method with N adders, the present invention requires less circuitry and less circuit area than the prior art.

The present invention disclosed a method and apparatus for the efficient implementation of a flash pipelined analog-to-digital converter with digital error correction using an incrementer/decrementer instead of adders. The use of incrementers/decrementers saves significant integrated circuit area. While the invention has been described with reference to an illustrative embodiment, this description is not intended to be construed in a limiting sense. Various modifications of the illustrative embodiment, as well as other embodiments of the invention, which are apparent to persons skilled in the art to which the invention pertains, are deemed to lie within the spirit and scope of the invention.

What is claimed is:

1. A circuit for correcting errors in N digital words generated by N+1 pipelined analog-to-digital converters, the circuit comprising:

N groups of pipeline registers, each group coupled to a respective one of the first N of the pipelined analog-to-digital converters, the N groups of pipeline registers synchronizing the N digital words; and N correctors, each coupled to a respective one of the N groups of pipeline registers and correcting the respective one of the synchronized N digital words, each of the N correctors also generating an output adjustment value within an output range based on an input adjustment value within an input range by an incrementing operation or a decrementing operation, the output range and the input range being equal, the input adjustment value for the first N-1 correctors being generated by the subsequent one of the first N correctors, the input adjustment value for the Nth corrector being generated by the N+1 analog-to-digital converter.

2. The circuit in claim 1 wherein one of the N correctors performs the incrementing operation when the input adjustment value is non-negative.

3. The circuit in claim 2 wherein the non-negative input adjustment value is one of 0 and 1.

4. The circuit in claim 1 wherein one of the N correctors performs the decrementing operation when the input adjustment value is negative.

5. The circuit in claim 4 wherein the negative input adjustment value is one of –2 and –1.

6. The circuit in claim 1 further comprises a result register coupled to the N correctors for storing a final result.

7. The circuit in claim 1 further comprises N digital-to-analog converter sections for producing N residue analog signals.

8. The circuit in claim 7 wherein N of the N+1 analog-to-digital converters convert the N residue analog signals into N least significant digital words.

9. The circuit in claim 7 wherein each of the N digital-to-analog converter sections further comprises:

a track-and-hold circuit coupled to receive a corresponding one of the N residue analog signals, the track-and-hold circuit generating a comparing residue signal;

a digital-to-analog converter (DAC) coupled to receive a corresponding one of the N digital words, the DAC converting the corresponding one of the N digital words into an adjusting analog signal;

an analog subtractor coupled to the track-and-hold circuit and the DAC to subtract the adjusting signal from the comparing residue signal to produce a next less significant analog signal; and an amplifier coupled to the analog subtractor to amplify the next less significant analog signal to produce a next less significant residue analog signal.

10. A method for correcting errors in N digital word generated by N+1 pipelined analog-to-digital converters, the method comprising steps of:

synchronizing the N digital words by N groups of pipeline registers; and correcting each of the synchronized N digital words by generating, for each of the N digital words, an output adjustment value within an output range based on an input adjustment value within an input range by an incrementing operation or a decrementing operation, the output range and the input range being equal, the input adjustment value for the first N-1 correctors being generated by the subsequent one of the first N correctors, the input adjustment value for the Nth corrector being generated by the N+1 analog-to-digital converter.

11. The method of claim 10 wherein correcting comprises performing the incrementing operation when the input adjustment value is non-negative.

12. The method of claim 11 wherein the non-negative input adjustment value is one of 0 and 1.

13. The method of claim 10 wherein correcting comprises performing the decrementing operation when the input adjustment value is negative.

14. The method of claim 10 wherein the negative input adjustment value is one of –2 and –1.

15. The method of claim 10 further comprises storing a final result in a result register.

16. The method of claim 10 further comprises producing N residue analog signals by N digital-to-analog converter sections.

17. The method of claim 16 further comprises converting the N residue analog signals into N least significant digital words.

18. The method of claim 16 wherein producing the N residue analog signals comprises:

generating a comparing residue signal by a track-and-hold circuit, the track-and-hold circuit receiving a corresponding one of the N digital words;

converting the corresponding one of the N digital words into an adjusting analog signal by a digital-to-analog converter (DAC);

subtracting the adjusting analog signal from the comparing residue signal by an analog subtractor to produce a next less significant analog signal; and amplifying the next less significant analog signal to produce a next less significant residue analog signal by an amplifier.

* * * * *